US007789319B2

(12) United States Patent
Marsh et al.

(10) Patent No.: US 7,789,319 B2
(45) Date of Patent: Sep. 7, 2010

(54) SYSTEM AND METHOD FOR RECIRCULATING FLUID SUPPLY FOR AN INJECTOR FOR A SEMICONDUCTOR FABRICATION CHAMBER

(75) Inventors: Eugene P. Marsh, Boise, ID (US); David R. Atwell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 808 days.

(21) Appl. No.: 11/383,923

(22) Filed: May 17, 2006

(65) Prior Publication Data

US 2007/0266941 A1 Nov. 22, 2007

(51) Int. Cl.
*B05B 17/00* (2006.01)

(52) U.S. Cl. .......................... 239/1; 239/124; 239/127; 239/585.1; 239/106; 239/112; 239/125; 118/715; 438/674; 438/678

(58) Field of Classification Search .................... 239/5, 239/124, 127, 88–96, 533.3–533.12, 584–585.5, 239/106, 112, 101, 125, 132–132.5, 1; 118/715; 123/516; 134/31, 104.2, 169 A, 169 C; 438/674, 438/678

See application file for complete search history.

(56) References Cited

U.S. PATENT DOCUMENTS 4,186,877 A * 2/1980 Wilcox et al. ............... 239/124
4,756,291 A 7/1988 Cummins et al.
5,042,445 A * 8/1991 Peters et al. .................. 239/88
5,237,975 A 8/1993 Betki et al.
5,438,968 A * 8/1995 Johnson et al. ............... 239/96
5,482,062 A * 1/1996 Chen ...................... 134/169 A
6,418,960 B1 * 7/2002 Mintz et al. ............. 134/169 C
6,461,436 B1 10/2002 Campbell et al.
6,610,169 B2 8/2003 Nguyen et al.
6,626,381 B2 * 9/2003 Parrish .................. 239/533.12
6,758,911 B2 7/2004 Campbell et al.
6,797,337 B2 9/2004 Dando et al.
6,916,374 B2 7/2005 Sandhu et al.
6,958,302 B2 10/2005 Ahn et al.
6,967,154 B2 11/2005 Meng et al.
7,000,636 B2 2/2006 Dando et al.
7,198,555 B2 * 4/2007 Dodge ..................... 239/132.5
7,431,020 B2 10/2008 Ramamurthy
2003/0134038 A1 7/2003 Paranjpe
2004/0097071 A1 5/2004 Ivanov
2005/0160983 A1 7/2005 Sneh

* cited by examiner

*Primary Examiner*—Steven J Ganey
(74) *Attorney, Agent, or Firm*—Schwegman, Lundberg & Woessner, P.A.

(57) ABSTRACT

One embodiment of the present subject matter includes a system which includes a tank, a conduit is adapted to carry a recirculating supply of fluid from the tank and into the tank, and at least one injector adapted to dispense fluid from the recirculating supply of fluid into a chamber.

40 Claims, 2 Drawing Sheets

SYSTEM AND METHOD FOR RECIRCULATING FLUID SUPPLY FOR AN INJECTOR FOR A SEMICONDUCTOR FABRICATION CHAMBER

TECHNICAL FIELD

This application relates generally to an injector system and method, and more particularly, to an injector system and method with a recirculating supply such as may be used in semiconductor fabrication.

BACKGROUND

Deposition chambers are used for manufacturing semiconductors. Most processes dispose the base material in the deposition chamber, and then admit additional materials into the chamber as is required by the specifications of the process. Variables under consideration include environmental conditions, such as heat and pressure in the chamber, and process parameters, such as the chemistries of combined materials, and the quantities of materials combined. Some processes require that materials added to the chamber be in a vapor state.

Some materials are sensitive to environmental conditions. For example, heat can cause constituent materials intended for use in the formation of a semiconductor device to undergo physical and/or chemical changes. Current reactor designs allow materials to stagnate, exposing them for prolonged periods to these environmental conditions. This can cause precipitation, condensing, cracking, clogging, chemical change, contamination, and other problems.

Chemical processes combine several chemical constituents. Economical use of these new processes requires improved precision in chemical dispensation. Additionally, it is desirable that systems used in combining chemicals allow new combination sequences.

DETAILED DESCRIPTION

The following detailed description of the present subject matter refers to subject matter in the accompanying drawings which show, by way of illustration, specific aspects and embodiments in which the present subject matter can be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present subject matter, in various embodiments, is used with processes for the formation of semiconductor devices. Some of these embodiments deal with the formation of thin films. Various embodiments are used with chemical vapor deposition ("CVD") processes. Some embodiments are used with atomic layer deposition ("ALD") processes. ALD, also known as atomic layer epitaxy, is a modification of CVD and is also called "alternatively pulsed CVD". In some ALD embodiments, precursors are introduced one at a time to the substrate surface mounted within a chamber. Chambers within the present subject matter are variously named deposition chambers, vaporization chambers, reactors, and/or epitaxial reactors. This list is not exhaustive or exclusive of the present subject matter, and other chambers fall within the present scope. This introduction of the precursors takes the form of pulses of each precursor fluid. In a pulse of a precursor fluid, the precursor is made to flow into a specific area or region for a short period of time. Between the pulses, the reaction chamber can be purged with a fluid, where the purging fluid can be an inert gas. Between the pulses, the reaction chamber can be evacuated. Between the pulses, the reaction chamber can be purged with a fluid and evacuated. The present subject matter may be used in other processes.

Various embodiments use flow control to manage the amount of precursor added during a process. The present subject matter includes embodiments other than or in addition to controlling precursor and purge fluid.

Various embodiments perform flow control using injectors. Some embodiments use mechanical injectors. Some embodiments use electro-mechanical injectors. Various injector embodiments are controlled electronically. Some injector embodiments are controlled by a computer which inputs information from other system areas in a feedback relationship. In various embodiments, one or more injectors tap into a recirculating conduit carrying a fluid such as a precursor.

Figure 1:
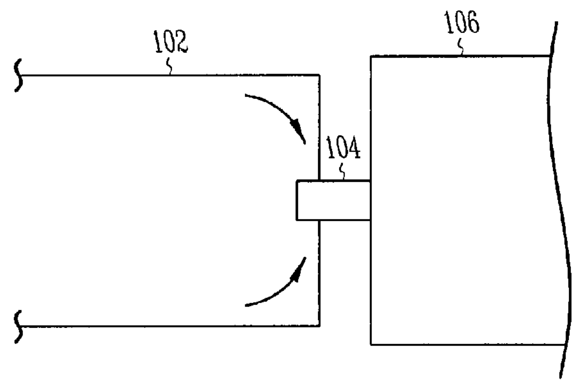
FIG. 1 illustrates a partial system for supplying fluid to a semiconductor fabrication chamber, according to one embodiment of the present subject matter.

FIG. 1 illustrates a system for supplying fluid to an injector, according to one embodiment of the present subject matter. Various embodiments include a conduit 102, an injector 104 and a chamber 106 into which an injector 104 is positioned to inject fluid. The illustration demonstrates that the conduit 102 is not a "dead end" type conduit, but rather is a recirculating conduit. Such a recirculating conduit enables fluid to pass by the injector 104 when the injector is not injecting fluid. Fluid not consumed during an injection cycle additionally flows by the injector, in various embodiments.

The present subject matter addresses various problems. Fluid in a noncirculating conduit stagnates when it is not being injected. A first problem concerns a difference in heat between the injector and the fluid. If there is a heat gradient, heat will flow between the injector and the fluid. Such heat flow can be unwelcome, as it can alter the fluid chemically, physically, or otherwise. Flowing the fluid constantly can reduce heat flow to acceptable levels. Another problem can occur due to undesired vibrations at the injector. Recirculating the fluid can reduce the effects of such vibrations. A further problem involves decomposition of precursor at the injector. In some embodiments of the present subject matter, such decomposition is diluted by the precursor stream as opposed to building up. Such a dilution strategy avoids clogging of the injector. If the precursor is in a solution, recirculating can keep the combination better distributed. Such a combination is better kept mixed in proportion with a recirculating system. Additionally, flushing a recirculation system is easier than with a nonrecirculating system, and an inline filter can be used to filter the recirculating supply.

Figure 2:
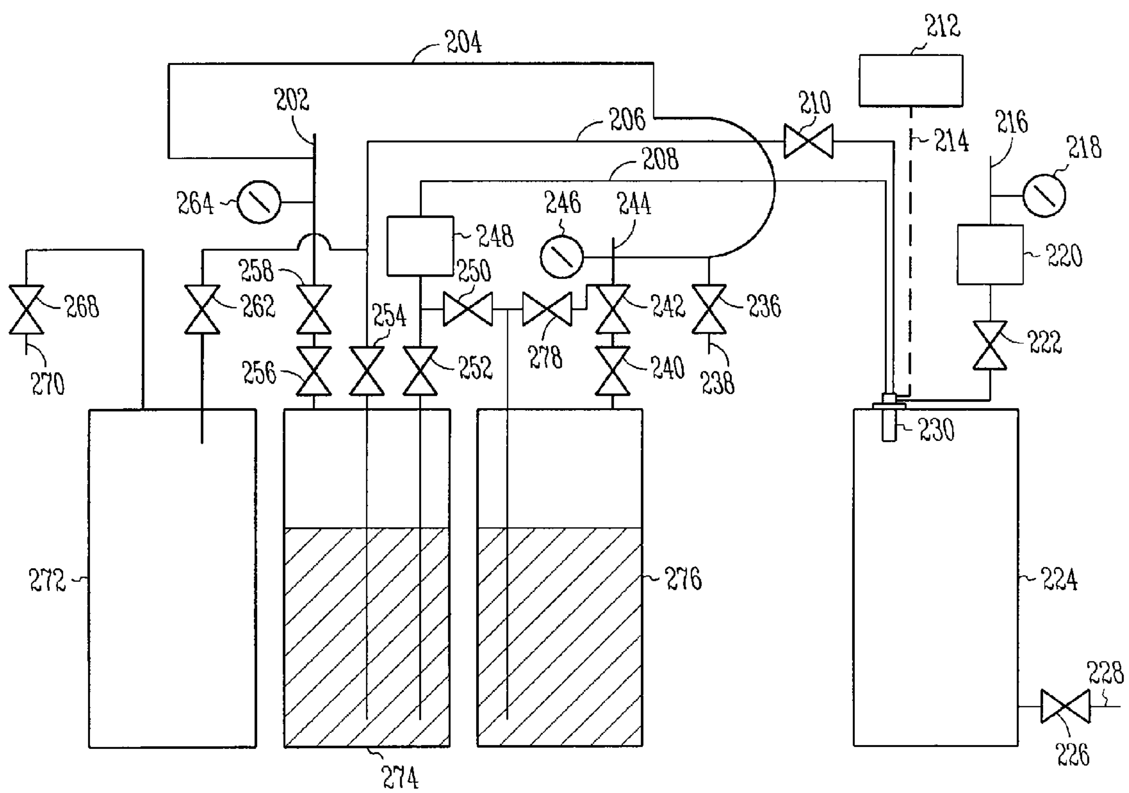
FIG. 2 illustrates a system for supplying fluid to a semiconductor fabrication chamber, according to one embodiment of the present subject matter.

FIG. 2 illustrates a system for supplying fluid to a semiconductor fabrication chamber, according to one embodiment of the present subject matter. The illustrated system includes a tank 274, which can be an ampule, or another form of fluid container. The tank 274, in various embodiments, includes a precursor in a liquid state. Additional embodiments within the present subject matter use a precursor which is in a non-liquid state. For example, the contents of tank can be in a gaseous state. Any supply of fluids to be injected fall within the present scope.

The illustrated system includes at least one conduit for recirculating fluid. Various embodiments include conduit 208 and conduit 206. In some embodiments, the conduit 206 includes a valve 254. In some embodiments, the conduit 208 includes a valve 252. A conduit interconnected with additional components is covered by the present scope. The present scope extends to any conduit adapted to provide a fluid communication circuit away from tank 274 and to tank 274.

Various embodiments include a pump 248. In some embodiments, the pump 248 recirculates fluid from the tank 274, through the conduit 208, through the injector 230, through the return conduit 206, and back into the tank 274. Although the pump 248 is illustrated as being positioned inline, before the injector 230, other embodiments position the pump elsewhere in the conduit. In some embodiments, the tank 274 is pressurized such that fluid is encouraged into the conduit 208. Pump 248 works in a number of configurations, including positive displacement configurations in some embodiments. In some embodiments, a dynamic pump configuration is used. The flow rate in various embodiments is dependent on the pump 248. In some embodiments, the flow rate is dependent on a throttling valve 210. A combination of control mechanisms to control flow also falls within the scope of the present subject matter.

In various embodiments, the pump 248 pressurizes a conduit at between approximately 20.0 pounds per square inch and approximately 100.0 pounds per square inch.

In various embodiments, the chamber 224 is pressurized at between approximately 0.001 torr and approximately 100 torr. In various embodiments, the chamber 224 is pressurized at between approximately 0.01 torr and approximately 10 torr. In various embodiments, the chamber 224 is pressurized at between approximately 6 torr and approximately 10 torr. In some embodiments, the chamber 224 is pressurized at approximately 5 torr. A pressure differential at the injector 230 exit has a beneficial impact on the vaporization of fluid dispensed into chamber 224, in various embodiments.

The pressure selected for use in the process depends, in various embodiments, on the conformality of the film. In some of these embodiments, the conformality of the film to deep features of a semiconductor including a high aspect ratio is measured. The pressure is selected to ensure good conformance to these deep features.

To control the instances of impurities in the conduits of the present subject matter, filters are employed in various embodiments. Filters can be positioned before the pump 248, before the injector 230, or after the injector 230. There are multiple options for the positioning of the filter, dependent on the type of pumping system used and the type of filter used. The filter, in many embodiments, is positioned for easy access and replacement.

In various embodiments, the pumping of fluid through conduit 208, through conduit 206, and through injector 230, results in fluid loss at tank 274, even when recirculation is occurring. Such “vapor lock” phenomena can be relieved by feeding make-up fluid to tank 274. If a make-up fluid is provided, various embodiments are able to maintain a substantially constant pressure inside tank 274. In some embodiments, a make-up fluid is provided at a higher pressure than exists in tank 274 such that fluids are encouraged out of tank 274. Make-up fluid at a pressure differential is pressurized by using pumps inline with conduit 202. Additional pressurization techniques also fall within the present scope.

Various embodiments include a conduit 202, which has a valve 258 and a valve 256. The two valves are used to control flow from the conduit 202 into the tank 274. Such valves can be configured to aid in swapping out an ampule, in various embodiments. Additionally provided in some embodiments is a gauge 264 which is used to monitor the pressure in a conduit 202. The make up fluid can be any of a suitable variety. Various embodiments include inert gasses. Some embodiments use argon.

The injector 230 can be of a number of injector varieties, in various embodiments. Some injector embodiments tap into a conduit and provide one exit nozzle. Some injector embodiments include multiple exit nozzles. Some embodiments include mechanical injectors. Some embodiments include electro-mechanical injectors. Solenoid based injectors are used in various embodiments. Injectors using piezoelectric ceramics are used in additional embodiments. Electrically controlled injectors, in various embodiments, are controlled via a control circuit 214. Control over the control circuit 214 is performed by a controller 212, in various embodiments. Controller 212 releases pulses of electricity which power an injector to open, in various embodiments.

In various embodiments, the injector controller is adapted to control the pulse width of the injector at between approximately 0.8 ms and 100.0 ms. In various embodiments, the injector controller is adapted to control the pulse width of the injector at between approximately 0.8 ms and 2.0 ms. In some of these embodiments, the pulse width is controlled to a range of approximately 0.8 ms to approximately 1.4 ms.

The length of a pulse width, in various embodiments, is dependent on the desired pressure in the reactor. In various embodiments, the pressure selected for use in the process depends, in various embodiments, on the conformality of the film. In some of these embodiments, the conformality of the film to deep features of a semiconductor including a high aspect ratio is measured. The pressure is selected to ensure good conformance to these deep features.

In additional embodiments, controller 212 powers a relay which in turn controls a high power circuit which opens and closes an injector. Injectors which could be fitted in the present in various embodiments include automotive fuel injectors. Some of these embodiments include injectors used on motorcycle engines. Various embodiments use injectors which are controlled using a dc current which ranges from approximately 6 volts to approximately 12 volts.

Various configurations using injectors fall within the present scope. Some embodiments include an injector which not only has an entrance and exit through which fluid can pass as part of a conduit, but it additionally has an connection point for a third fluid. Various embodiments include a conduit 216. In various embodiments, the conduit provides a purge fluid which can purge the atmosphere of chamber 224. In various embodiments, a limited amount of purge fluid is allowed to enter chamber 224. Control valve 222 can prevent fluid from entering chamber 224 all together. Gauge 218 can be used to monitor pressure in conduit 216. A mass flow sensor 220 can be used as part of a system which controls the amount of fluid which passes through conduit 216. In some embodiments, the fluid which flows through conduit 216 is argon.

Although the illustrated embodiments pictures one injector 230, additional embodiments use multiple injectors. Some embodiments use multiple injectors, with each injector being able to dispense a range of fluids, including precursors and purge fluids. Purge fluids are in a gaseous state, in various embodiments. Additional embodiments use multiple injectors, with each injector exclusively dispensing a single fluid. Other combinations of injectors and fluids injected by such injectors exist within additional embodiments.

Various embodiments inject fluid into a chamber 224. In some embodiments, the chamber 224 is an epitaxial reactor. Some of these embodiments are used in the formation of layers on semiconductor devices. Chambers of multiple varieties fall within the present scope. Some designs within the scope of the present subject matter include a conduit 228, which is suitable for allowing fluid to exit the chamber 224. In some embodiments, the conduit 228 includes a valve 226 which is used to control flow through conduit 226.

Various embodiments include the ability to augment fluids existing in conduits, or remove them completely from conduits. In such operations, various embodiments employ multiple valves, conduits, and tanks. Various embodiments employ purging fluids. Some embodiments include solvents. Materials suitable for these functions fall within the present scope. Purging fluids include argon gas, in various embodiments. Examples of fluid solvents include toluene and THF (tetra hydra furan). This list is not exclusive or exhaustive of the present subject matter, and additional fluids fall within the present scope.

Various embodiments include a tank 276. Tank 276 can be an ampule or another variety of fluid container. Tank 276, in various embodiments, houses a fluid solvent. The present system manages the fluids interchange with tank 276 in various ways. In some embodiments, the valve 250 is adjusted such that fluid can flow into conduit 208. If valve 252 is open, fluid can flow into tank 274, in various embodiments. In embodiments where it is desirable to combine a fluid with a precursor, fluid is forced through open valve 250 and into conduit 208, mixing with fluid in conduit 208. If the fluid in conduit 208 is recirculating, mixing is improved.

In various embodiments, a purging fluid is supplied at conduit 244. In some embodiments, purging fluid flows into tank 278 if valve 278 is open. If valve 250 is open, a purging fluid can flow into conduit 208 and into tank 274, in various embodiments. A suitable purging fluid is argon gas, in some embodiments. Other embodiments use different fluids, or additional fluids.

In processes where fluid in tank 276 is continuously used, such as embodiments where fluid is continuously disposed into conduit 208 and then into chamber 224, a make-up fluid can flow into tank 276 to prevent “vapor-lock”. In various embodiments, a make-up fluid is provided at conduit 244. In some embodiments, the make-up fluid is provided through conduit 204. Such a fluid is inert in various embodiments. In some embodiments, the fluid is argon gas. The make-up fluid flows through valve 242 and valve 240 and into tank 276. The introduction of a make-up fluid, in various embodiments, enables the maintenance of a substantially constant pressure in tank 276, in various embodiments. In some embodiments, a make-up fluid is provided at a higher pressure than outlets in tank 276 such that fluids are encouraged out of tank 276 through such outlets. Valves 242 and 240 are useful for controlling flow during swap-out of and ampule, in various embodiments. Gauge 246 is useful in monitoring conduit 244. For example, some embodiments monitor pressure in conduit 244. Valve 236 controls flow to a conduit 238, which in various embodiments induces a pressure differential across valve 236. Such a pressure difference can be useful in vacuum operations, and pressurized operations, in various embodiments. In some embodiments, a purging fluid is introduced through conduit 238.

The present subject matter includes tank 272 for trapping fluids, in various embodiments. In some embodiments, a pressure differential is introduced in tank 272 through conduit 270. Such a pressure differential can be controlled by valve 268, in various embodiments. The disposition of fluids into tank 272 is controlled with valve 262, in various embodiments. A lower pressure in tank 272 is suited to encourage the flow of fluid into tank 272. In some embodiments, valves 252, 250, 210, 254, and 262 are manipulated to encourage the flow of solvent into tank 272. Such flow is pumped, in various embodiments, by a vacuum introduced in conduit 270.

Several operating states are realized through the adjustment of valves in the present subject matter. The systems of the present subject matter include valves such that multiple conduits can be purged. The systems of the present subject matter additionally are able to course the conduits with solvents. The systems of the present subject matter additionally are able to introduce multiple fluids into a recirculating conduit to which an injector has access such that the injector can inject the multiple fluids in a mixed state. The present subject matter includes valving to enable the replacement of multiple components while minimizing the exposure of conduits to atmosphere. Such operative embodiments include ones in which valves 258, 254, and 252 are closed, in order to replace tank 274. Embodiments additionally include closing valves 250, 278, and 240 to replace tank 276.

The present system is designed to enable routine maintenance. Filters used in conduits are replaceable, in various embodiments. Additionally, injector 230 is replaceable in various embodiments. The tanks are replaceable, in various embodiments. The valving enables replacement of such components without compromising the contents of conduits, in various embodiments.

Figure 3:
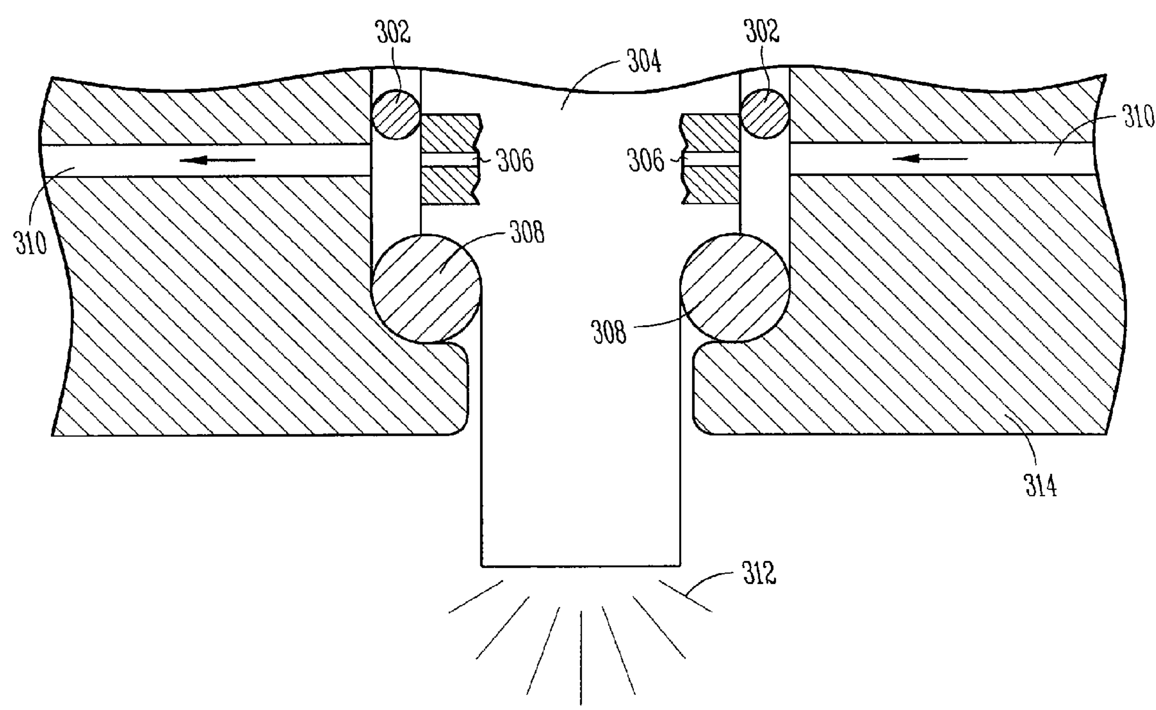
FIG. 3 illustrates a partial cross section of an injector, according to one embodiment of the present subject matter.

FIG. 3 illustrates a partial cross section of an injector, according to one embodiment of the present subject matter. In various embodiments, a reactor 314 mates with an injector 304. The injection 304 includes ports 306. In various embodiments, these ports serve as an inlet and an outlet for a recirculating supply of fluid. In various embodiments, the injector is adapted to spray fluid 312. The injector is sealed to the reactor 314 with o-ring 308 in various embodiments. In various embodiments, the injector is sealed to the reactor 314 with o-ring 302. O-ring 302 and o-ring 308 create a sealed chamber which conduit 310 interfaces with. In additional embodiments, conduit 310 is sealed to injector 304 using optional techniques. For example, threads are used in various embodiments. Some embodiments use an adhesive. This list of seals is not exhaustive or exclusive, and other seals not listed herein fall within the present scope.

Although specific embodiments have been illustrated and described herein, it will be appreciated by those of ordinary skill in the art that any arrangement which is calculated to achieve the same purpose can be substituted for the specific embodiment shown. This application is intended to cover adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter should be determined with reference to the appended claims, along with the full scope of equivalents to which such claims are entitled.

What is claimed is:

1. A system, comprising:

a tank;

a conduit adapted to carry a constantly recirculating supply of fluid from the tank and into the tank during a deposition process; and at least one injector adapted to dispense fluid from the recirculating supply of fluid into an interior of a semiconductor fabrication chamber, the injector including an inlet coupled to the conduit and an outlet coupled to the conduit, the inlet and outlet in fluid communication with each other during:

a first state of operation of the deposition process in which an injector nozzle exit of the injector is open to establish fluid communication between the inlet and the interior of the semiconductor fabrication chamber; and a second state of operation of the deposition process in which the injector nozzle exit is closed to the interior of the semiconductor fabrication chamber.

2. The system of claim 1, wherein the chamber is a vaporization reactor.

3. The system of claim 2, wherein the chamber is an epitaxial reactor.

4. The system of claim 1, further comprising a pump connected to the conduit.

5. The system of claim 4, further comprising an injector controller connected to the injector, and adapted to control the injector.

6. The system of claim 5, further comprising a plurality of injectors adapted to dispense fluid from the conduit and into the chamber.

7. The system of claim 1, wherein the injector is an automotive fuel injector.

8. The system of claim 7, wherein the automotive fuel injector operates at approximately 12 volts.

9. The system of claim 7, wherein the automotive fuel injector is adapted for use with a motorcycle engine.

10. The system of claim 9, wherein the automotive fuel injector operates at approximately 6 volts.

11. A system, comprising:

a tank;

a conduit connected to the tank, the conduit coupled to a fluid exit from the tank, and further coupled to a fluid entrance to the tank, the fluid entrance in fluid communication with the fluid exit to direct a recirculating fluid flow;

a recirculation pump connected to the conduit to recirculate the fluid through the conduit along the recirculating fluid flow during a deposition process; and an injector connected to the conduit, with the recirculating fluid flow extending into an injector fluid supply inlet and out an injector fluid supply outlet, the injector connected to a semiconductor fabrication chamber such that at least one injector exit is positioned inside the semiconductor fabrication chamber to direct a fluid from the injector fluid supply inlet and into the semiconductor fabrication chamber through the at least one injector exit, wherein the recirculation pump is to recirculate the fluid through the injector during the deposition process, and wherein in a first state of operation during the deposition process, the injector exit is in fluid communication with the recirculating fluid flow, and in a second state of operation during the deposition process the injector exit is closed from the interior of the conduit.

12. The system of claim 11, further comprising an injector controller connected to the injector, and adapted to control the injector.

13. The system of claim 12, wherein the injector controller includes a pulse generator.

14. The system of claim 11, wherein the pump is a positive displacement pump that is connected to the conduit.

15. The system of claim 14, wherein the pump is a dynamic pump.

16. The system of claim 11, wherein the conduit includes a filter.

17. The system of claim 16, wherein the filter is replaceable.

18. The system of claim 11, wherein the fluid is a precursor.

19. The system of claim 18, wherein fluid in the conduit is in a liquid state.

20. The system of claim 19, wherein the fluid includes Sr(thd)2.

21. A system, comprising:

storage means for storing a fluid;

recirculating means for constantly recirculating fluid from the storage means and into the storage means during a deposition process; and an injector to inject the fluid from the storage means into a semiconductor fabrication chamber during a injection portion of the deposition process and to seal fluid from the semiconductor fabrication chamber during a further portion of the deposition process, the recirculating means for constantly recirculating the fluid through an inlet and an outlet of the injector, wherein the injector is to inject fluid from the inlet into the semiconductor fabrication chamber through an injector exit.

22. The system of claim 21, wherein:

the storage means include a tank.

23. The system of claim 21, wherein:

the recirculating means include a conduit adapted for carrying a recirculating supply of fluid from the storage means and into the storage means.

24. The system of claim 21, wherein:

the dispensing means include at least one injector adapted to dispense the fluid from the conduit into a chamber.

25. A method of operating a system, comprising:

storing a fluid in a tank;

pumping the fluid, during a deposition process, from the tank and into a conduit and by an inlet and an outlet of an electrical injector;

controlling the electrical injector such that the electrical injector dispenses the fluid from the conduit, through the inlet, and into a semiconductor fabrication chamber through an exit during an injection portion of the deposition process, and seals the semiconductor fabrication chamber from the fluid in the conduit during a further portion of the deposition process; and collecting an uninjected portion of the fluid into the tank, wherein the pumping and collecting occur during both the injection portion of the deposition process and the further portion of the deposition process.

26. The method of claim 25, further comprising dispensing a purge fluid into the conduit such that the purge fluid substantially displaces the fluid from the conduit.

27. The method of claim 26, wherein the purge fluid includes argon.

28. The method of claim 25, further comprising pumping a makeup fluid into the tank.

29. The method of claim 28, further comprising dispensing makeup fluid into the tank such that the pressure in the tank is substantially constant.

30. The method of claim 28, further comprising dispensing makeup fluid into the tank such that fluid is forced into the conduit.

31. The method of claim 25, further comprising dispensing a solvent into the conduit to clean the conduit.

32. The method of claim 31, further comprising pumping the solvent through the conduit and into a trap tank such that solvent passes through the conduit without passing into the tank.

33. The method of claim 32, further comprising maintaining a lower pressure in the trap tank than exists in the conduit such that the solvent is dispensed into the trap tank.

34. A method of operating a system, comprising:

storing a fluid in a tank; and during a deposition process:

constantly recirculating fluid through a conduit, the fluid flowing from the tank and into the tank and through an inlet and an outlet of an injector; and dispensing the fluid from the conduit into a semiconductor fabrication chamber by powering an injector to open a nozzle exit to open the inlet of the injector to the semiconductor fabrication chamber during an injection portion of the deposition process and to close the nozzle exit to close the inlet of the injector from the semiconductor fabrication chamber during a further portion of the deposition process.

35. The method of claim 34, further comprising dispensing a purge fluid into the injector such that the purge fluid enters the chamber and substantially occupies an atmosphere of the chamber.

36. The method of claim 35, wherein the purge fluid includes argon.

37. The method of claim 35, further comprising controlling the dispensation of the purge fluid into the chamber using a flow controller.

38. The method of claim 37, wherein the flow controller is a mass flow controller.

39. The method of claim 34, further comprising throttling fluid flowing through the conduit.

40. The method of claim 39, wherein the throttle is downstream of the injector.

* * * * *